(12) United States Patent
Kemerer et al.

(10) Patent No.: US 7,759,189 B2
(45) Date of Patent: Jul. 20, 2010

(54) METHOD OF MANUFACTURING A DUAL CONTACT TRENCH CAPACITOR

(75) Inventors: Timothy W. Kemerer, Essex Junction, VT (US); Jenifer E. Lary, Hinesburg, VT (US); James S. Nakos, Essex Junction, VT (US); Steven M. Shank, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 12/181,338

(22) Filed: Jul. 29, 2008

(65) Prior Publication Data

US 2010/0029056 A1    Feb. 4, 2010

(51) Int. Cl.
*H01L 21/8242* (2006.01)
(52) U.S. Cl. .................. 438/243; 438/248; 438/386; 257/E21.016
(58) Field of Classification Search ................ 438/243, 438/244, 248, 386; 257/301–304, E21.016, 257/E21.019
See application file for complete search history.

(56) References Cited

U.S. PATENT DOCUMENTS

| 4,645,564 | A | 2/1987 | Morie et al. | |
|---|---|---|---|---|
| 6,455,369 | B1 | 9/2002 | Forster et al. | |
| 6,750,096 | B2 | 6/2004 | Steck et al. | |
| 7,122,439 | B2 * | 10/2006 | Kwon et al. | 438/386 |
| 7,344,953 | B2 * | 3/2008 | Hecht et al. | 438/386 |
| 2005/0110114 | A1 * | 5/2005 | Lu et al. | 257/532 |
| 2006/0134877 | A1 | 6/2006 | Goebel et al. | |
| 2007/0058458 | A1 | 3/2007 | Pan | |
| 2007/0148899 | A1 | 6/2007 | Kim | |
| 2008/0291601 | A1 * | 11/2008 | Roozeboom et al. | 361/306.2 |

OTHER PUBLICATIONS

Office Action for corresponding U.S. Appl. No. 12/181,343.

* cited by examiner

*Primary Examiner*—Tuan N. Quach
(74) *Attorney, Agent, or Firm*—Anthony J. Canale; Roberts Mlotkowski Safran & Cole, P.C.

(57) ABSTRACT

A method of manufacturing a dual contact trench capacitor is provided. The method includes a first plate extending from a trench and isolated from a wafer body, and forming a second plate extending from the trench and isolated from the wafer body and the first plate.

20 Claims, 7 Drawing Sheets

Trench dielectric boundary

Tab approach to making trench contacts

METHOD OF MANUFACTURING A DUAL CONTACT TRENCH CAPACITOR

CROSS-REFERENCE TO RELATED APPLICATIONS

This application is related to U.S. Ser. Nos. 12/181,338, 12/181,335 and 12/181,341 filed on the same day and currently pending.

FIELD OF THE INVENTION

The present invention generally relates to a method of manufacture a trench capacitor, and more particularly, to method of manufacturing a dual contact trench capacitor.

BACKGROUND OF THE INVENTION

Capacitors are used to store charge in integrated circuits (ICs) such as in DRAM and SRAM cells. However, the growing demand for increasingly smaller and thus more cost effective semiconductor devices, e.g., with large memory capacities, has pushed the development of miniaturized structures in sub-micron technologies. But such miniaturization has its limits. For example, the size of the capacitor becomes increasingly larger with regard to the circuit itself, thus taking up considerable chip real estate. Also, in certain applications, the capacitor can become easily disrupted due to radiation or other unwanted external charging events.

By way of example, for certain radiation hardened applications the use of a dual capacitor dual, resistor feedback has been used. These structures, though, take up a considerable amount of real estate, for example. Other applications include a single capacitor and two resistor configuration which is believed to be more robust to exposure to high radiation environments such as space applications. However, this approach places additional requirements on the properties of the capacitor. In particular, both electrodes cannot be contacting any part of the silicon, either diffusion or substrate. If they are a radiation event will upset the SRAM cell, regardless of where the electrons hit the cell. For example, in a radiation environment, electron hole pairs (e.g., carriers of electric charge) will be swept to a voltage potential which, in turn, will disrupt the state of the capacitor.

Also, it is known to use MIMs in radiation and other environments. However, as technology nodes have advanced the capacitance values attainable at practical sizes have not been able to scale with the circuit requirements.

Accordingly, there exists a need in the art to overcome the deficiencies and limitations described hereinabove.

SUMMARY OF THE INVENTION

In a first aspect of the invention, a method comprises forming a first plate extending from a trench and forming a second plate independent of the first plate. The second plate extends from the trench and is isolated from a wafer body and the first plate.

In an additional aspect of the invention, a method comprises: forming a first plate extending from a trench and isolated from a wafer body; forming independently a second plate extending from the trench and isolated from the wafer body and the first plate; forming a dielectric layer isolating the first plate from the second plate; forming a dielectric layer isolating the first plate from the wafer body; and forming an isolation structure within the wafer body and on sides of the first plate and the second plate. The first plate and the second plate are connected to contacts at least partially within a trench dielectric boundary.

BRIEF DESCRIPTION OF SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention generally relates to method of manufacturing a dual contact trench capacitor. By implementing the invention, it is now possible to prevent radiation or other unwanted charging events from disrupting the capacitor. This is possible by providing isolated contacts or electrode plates in a dual contact trench capacitor arrangement. Also, the present invention provides more capacitance using conventional dielectrics than known MIM (Metal Insulator Metal) structures thus allowing a more extendable approach. Also, the contact trench capacitor arrangement of the present invention is scalable and easily tunable with future generation devices. The present invention is well adapted for space and military applications.

Fabrication Processes

Figure 1:
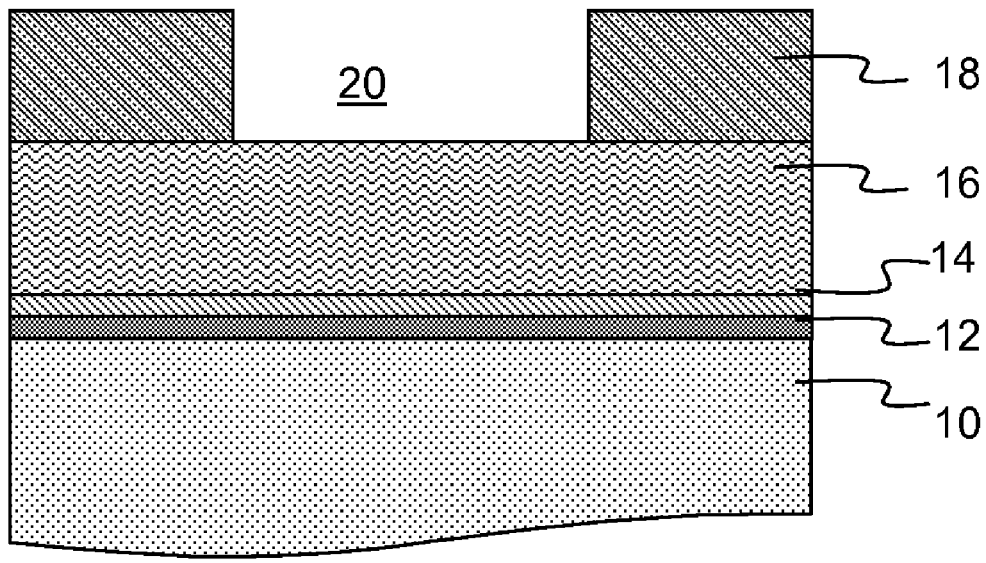
FIG. 1 represents a beginning structure and processes for fabricating the structure in accordance with the invention.

FIG. 1 represents a beginning structure and processes for fabricating the structure in accordance with the invention. More specifically, FIG. 1 shows a silicon dioxide ($SiO_2$) layer 12 formed on a conventional substrate 10 such as silicon (e.g., wafer body). In embodiments, the $SiO_2$ layer 12 is deposited on the substrate 10 in a conventional deposition process. The $SiO_2$ layer 12 can range in thickness depending on its application. More specifically, in one illustrative non-limiting example, the $SiO_2$ layer 12 can range in thickness from about 50 Å to 600 Å.

A Silicon Nitride (SiN) layer 14 is deposited on the $SiO_2$ layer 12 layer in a conventional deposition process. The SiN layer 14 is preferably $Si_3N_4$ with a thickness of about 1200 Å, but may range from about 500 Å; to 500 Å; although, other thicknesses are also contemplated by the invention. A dielectric layer 16 is deposited on the SiN layer 14 in a conventional deposition process known to those of skill in the art. In embodiments, the dielectric layer 16 is BPSG (boro-phospho-silicate glass) with one contemplated thickness of about 10,000 Å.

A resist 18 is selectively patterned on of the dielectric layer 16 to form an opening 20. The resist 18 can be patterned in any conventional manner such as, for example, exposing the resist 18 to a light source. For example, a mask material (not shown) may be deposited over the resist 18 at selective portions. For reasons of discussion, the mask is formed over a dual contact trench capacitor location. Once the mask is formed, using conventional photolithographic processes, a hole can be opened to expose portions of the dielectric layer 16. The exposed portions of the dielectric layer 16 are then etched using a conventional reactive ion etching process.

Figure 2:
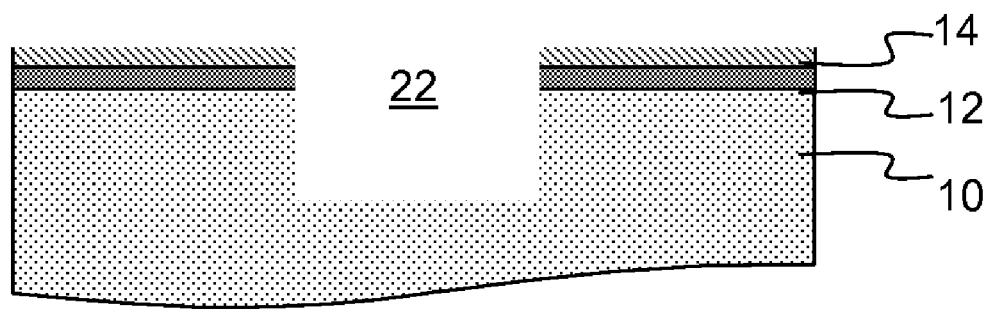
FIGS. 2-12 represent intermediate and final structures and respective processes for fabricating the structure in accordance with the invention.

Referring to FIG. 2, a trench 22 is formed in the substrate 10 using conventional etching processes. More specifically, using conventional etching processes such as, for example, Reactive Ion Etching (RIE), an opening is formed through the dielectric layer 16, SiN layer 14 and $SiO_2$ layer 12 and into the substrate 10. In this etching process, the RIE will also etch away the resist 18 and, using an HF solution, the dielectric layer 16. Although not shown, it should be understood that remnants of the dielectric layer 16 may still be present on the SiN layer 14 after the etching process. In embodiments, the HF solution can be a buffered or dilute HF solution, which is selective to SiN. Also, as should be understood by those of skill in the art, the dielectric layer 16 may act as a mask during the etching process.

In embodiments, the trench 22 can be of many different depths, depending on the capacitance targets. For example, the trench 22 can extend entirely through the substrate 10 in order to provide higher capacitance due to an increased surface area of subsequently formed plates. In other non-limiting embodiments, though, the trench 22 can range in depth from about 4 microns to about 10 microns.

Figure 3:
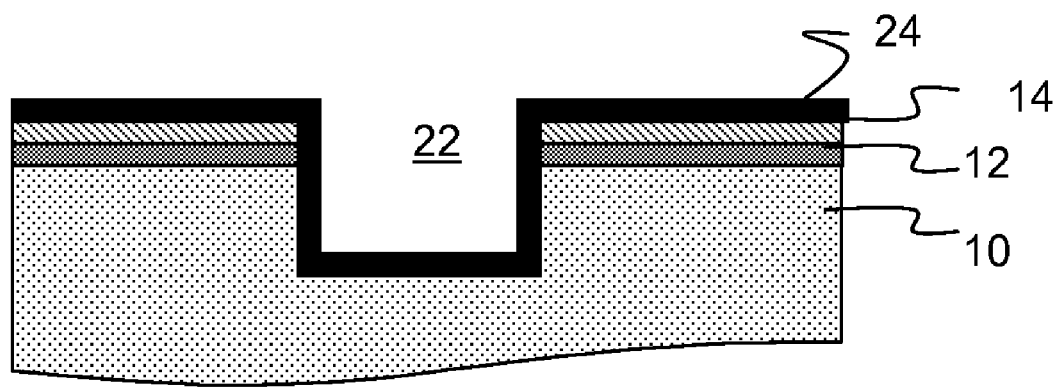

In FIG. 3, a dielectric material 24 is deposited on the structure of FIG. 2, including within the trench 22. The dielectric material 24 may be deposited using any conventional deposition process such as, for example, chemical deposition processes (CVD). In embodiments, CVD is known to increase the conformance of the dielectric material 24 over the structure. The dielectric material 24 may be, for example, Silicon Nitride, Silicon Oxide, Silicon oxynitride or a composite stack of Oxide Nitride Oxide. In embodiments, the dielectric material 24 isolates the substrate 10 from subsequently formed electrode plates thereby eliminating capacitance discharge that may result from an unwanted charging event. To minimize the capacitance coupling with the substrate, the dielectric material 24 can be in the range of about 800 Å to about 900 Å.

It is also contemplated that a capacitor can be formed with the dielectric material 24, a conductive layer (see, FIG. 5.) and the substrate 10. For example, the dielectric material 24 can be thinly deposited, typically in the range of about 20 Å, such that a capacitor is formed with the dielectric material 24 (insulator), a subsequently laid conductive layer (e.g., a first plate of the capacitor) and the substrate 10 (e.g., a second plate of the capacitor). As should be known to those of skill in the art, the thickness of the dielectric material 24 may vary depending on the capacitance targets, with thinner layers increasing the capacitance of the capacitor.

Figure 4:
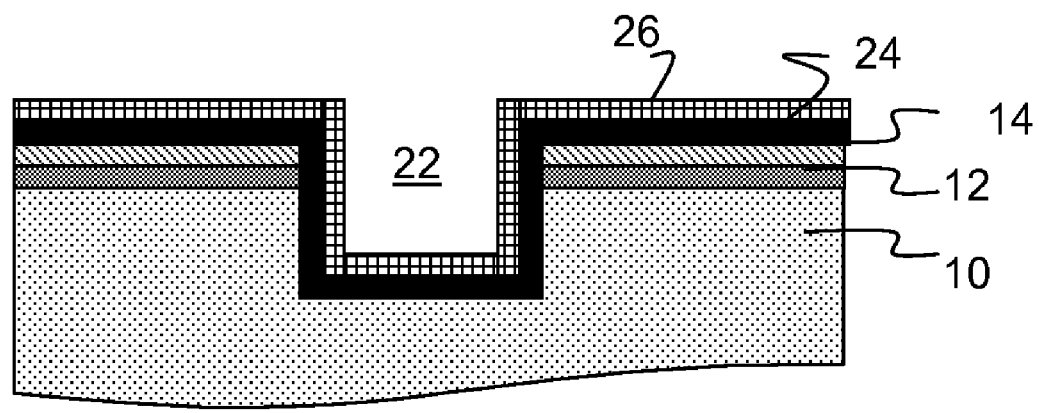

FIG. 4 shows a deposition of a poly layer 26 over the structure of FIG. 3. In embodiments, the deposition process is a conventional CVD process. In further embodiments, the poly layer 26 can range in thickness from about 500 Å to about 1500 Å. In still further embodiments, the poly layer 26 can be substituted with a metal layer or a metal silicide layer in order to obtain different temperature coefficients. The metal silicide layers contemplated by the invention include, for example, Tungsten Silicide, Titanium Silicide or Cobalt Silicide.

As should be understood by those of skill in the art, the layer 26 (whether a poly, metal, metal silicide or other electrical conductor, will form a lower plate of the electrode, which will be exposed on the upper surface of the structure to form a contact region. The lower plate will be an independent electrode, isolated from the wafer body (i.e., substrate). In this manner, electron hole pairs created by, for example, radiation or other unwanted charging events, will not be swept to the first electrode as it is isolated from the wafer body. As such, the electrons hitting the wafer body will not disrupt the capacitor.

Figure 5:
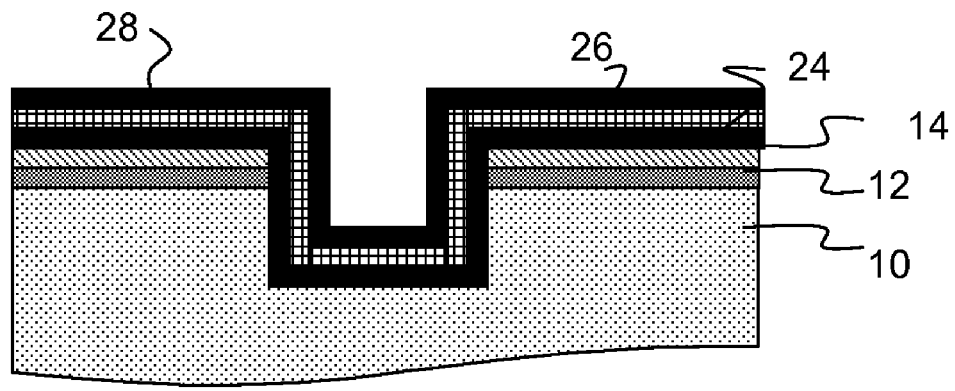

In FIG. 5, a dielectric material 28 is deposited on the structure of FIG. 4. The dielectric material 28 may be deposited in any conventional deposition process such as, for example, chemical deposition processes (CVD). The dielectric material 28 may be, for example, Silicon Nitride, Silicon Oxide, Silicon Nitride Oxide, Silicon oxynitride or a composite stack of Oxide Nitride Oxide. In embodiments, the dielectric material 28 can be in the range of about 20 Å to about 100 Å in thickness. As should be known to those of skill in the art, the thickness of the dielectric material 28 may vary depending on the capacitance targets, with thinner layers increasing the capacitance of the capacitor.

Figure 6:
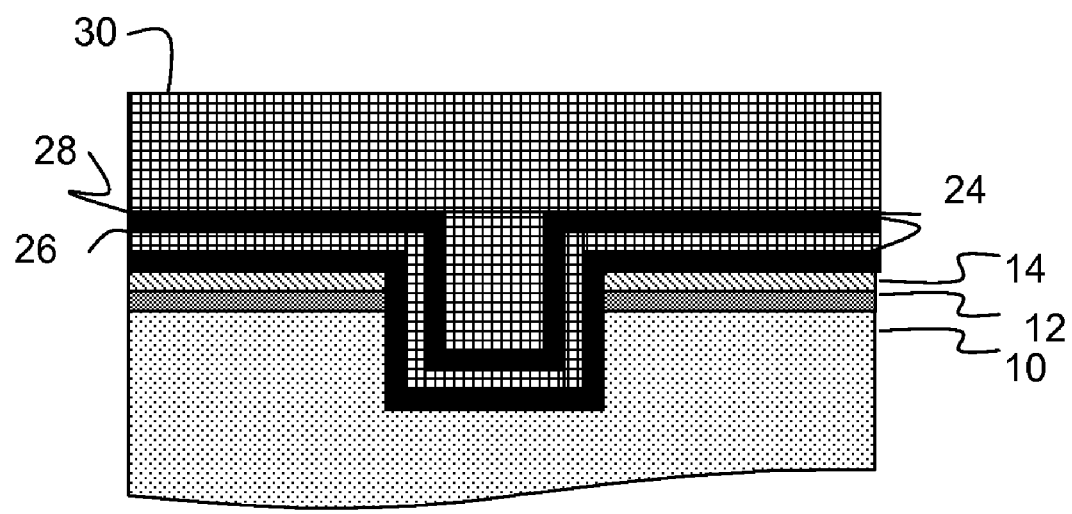

FIG. 6 shows a deposition of a poly layer 30 over the structure of FIG. 5 using a conventional CVD process. In embodiments, the poly layer 30 can completely fill the trench. In still further embodiments, the poly layer 30 can be substituted with a metal layer or a metal silicide layer in order to obtain different temperature coefficients. The metal silicide layers contemplated by the invention include, for example, Tungsten Silicide, Titanium Silicide or Cobalt Silicide. In embodiments, it is preferable to match the poly layer 26 with the poly layer 30.

The layer 30 (whether a poly, metal or metal silicide) will form an upper plate of the electrode, which will be exposed on the upper surface of the structure to form a contact region. The upper plate will be an independent electrode, isolated from the wafer body (i.e., substrate) and the lower plate. Much like the lower plate, in this manner, electron hole pairs created by, for example, radiation or other unwanted charging events, will not be swept to the first electrode as it is isolated from the wafer body. As such, the electrons hitting the wafer body will not disrupt the capacitor.

Figure 7:
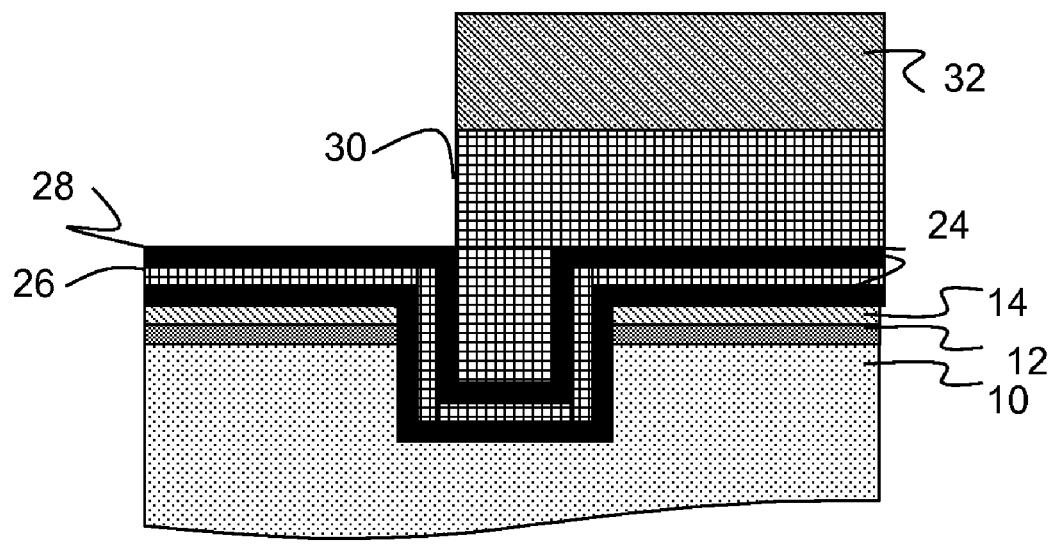

In FIG. 7, a resist 32 is placed over the structure of FIG. 6, and preferably over the filled trench. In a conventional manner, as discussed above, selective portions of the resist 32 are opened and an etching process is performed to etch a portion of the poly layer 30, on the side of the filled in trench. The etch may be designed to be selective to the dielectric layer 28.

Figure 8:
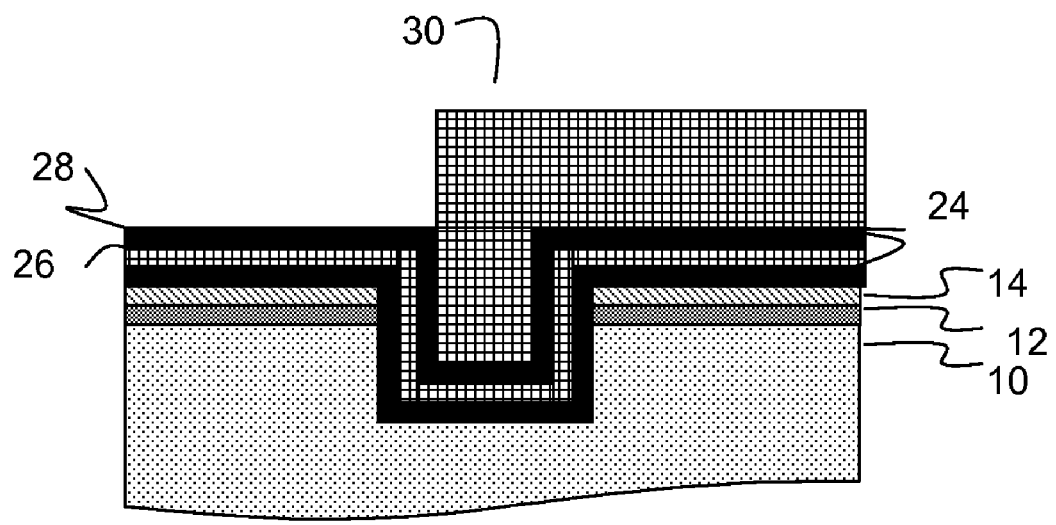

In FIG. 8, the resist layer 32 is removed. In embodiments, the dielectric material 28 can also be removed during the removal of the resist layer 32. This process will expose the poly layer 26, which will form the independent and isolated lower plate of the capacitor.

Figure 9:
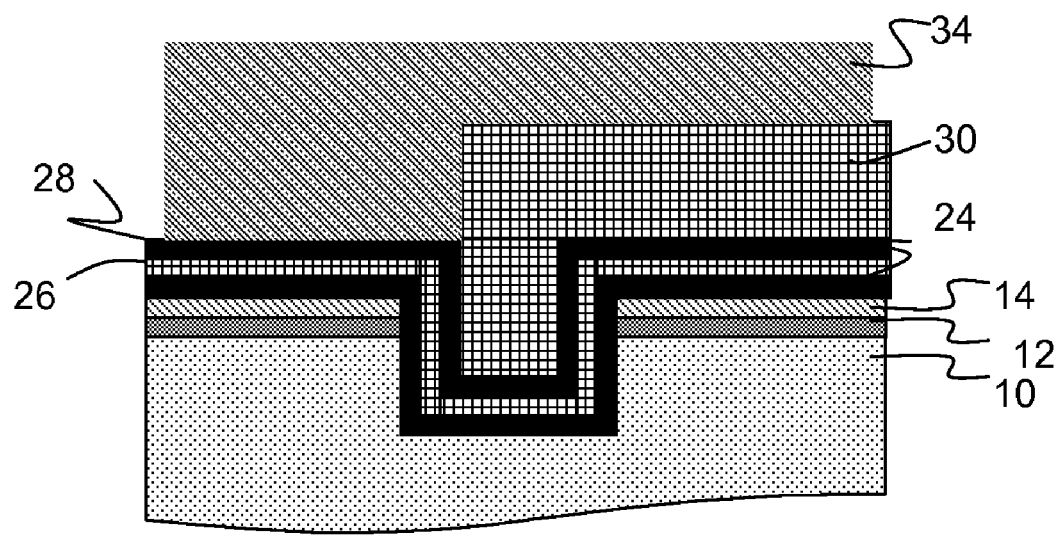
Figure 10:
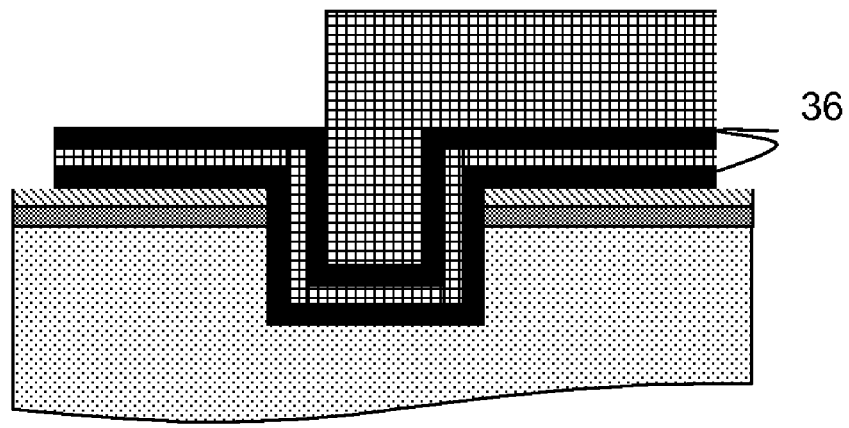

In FIG. 9, a resist 34 is applied to the structure of FIG. 8. In embodiments, the resist 34 is opened so that it does not extend across the entire structure of FIG. 8. As discussed above, the resist 34 can be patterned in any conventional manner such as, for example, exposing the resist to a light source. In embodiments, after an etching process, e.g., RIE, this arrangement will result in a shoulder 36 such as shown in FIG. 10. The deposition and etching of the resist can be in such a manner to also eliminate or substantially eliminate the shoulder.

Figure 11:
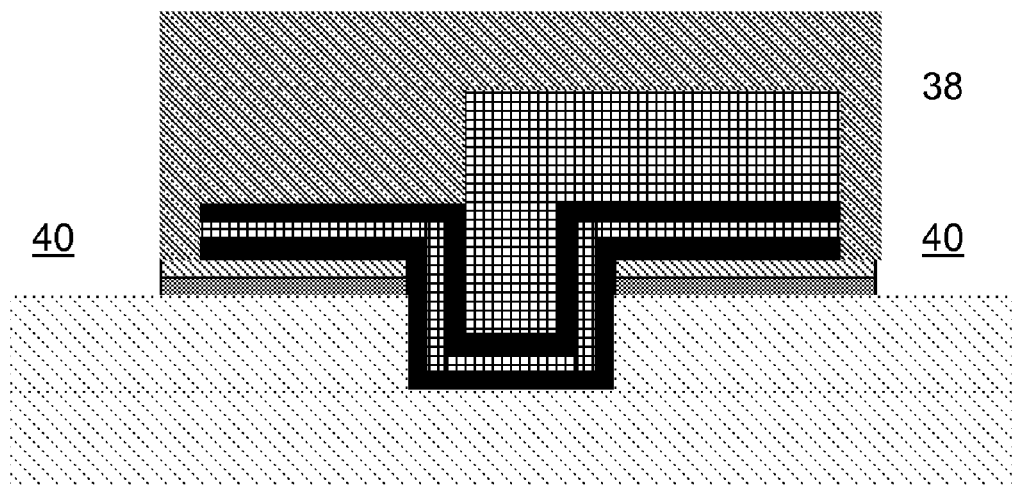

In FIG. 11, a resist 38 is formed over the structure of FIG. 10. The resist 38 is selectively patterned to form openings 40. As discussed above, the resist 38 can be patterned in any conventional manner such as, for example, exposing the resist to a light source.

Figure 12:
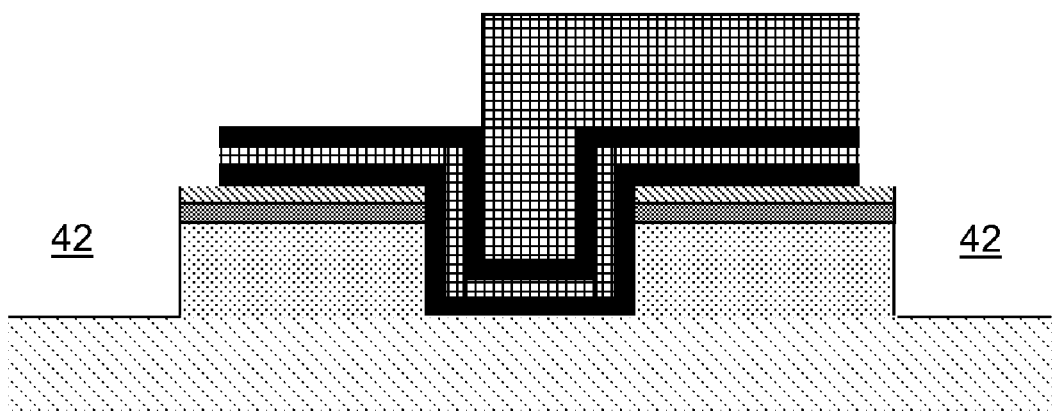

As shown in FIG. 12, the structure of FIG. 11 is etched using a conventional etching process such that portions of the Silicon Nitride (SiN) layer 14, $SiO_2$ layer 12 and substrate are etched to form trenches 42. The trenches 42 are subsequently filled with, e.g., an oxide material, to form conventional shallow trench isolation structures (STI).

Figure 13A:
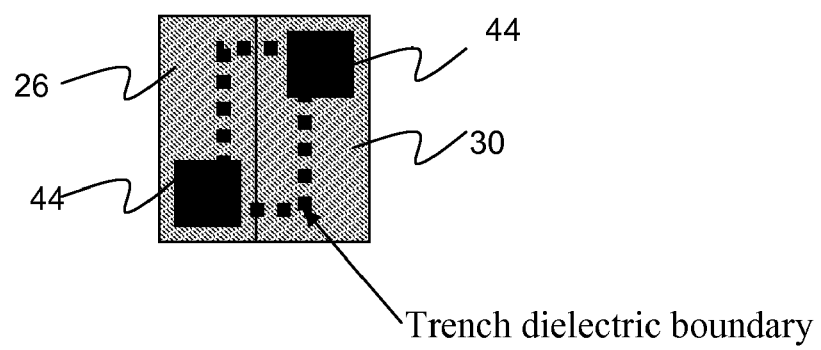
FIGS. 13a and 13b show a top view of final structures in accordance with the invention.
Figure 13B:
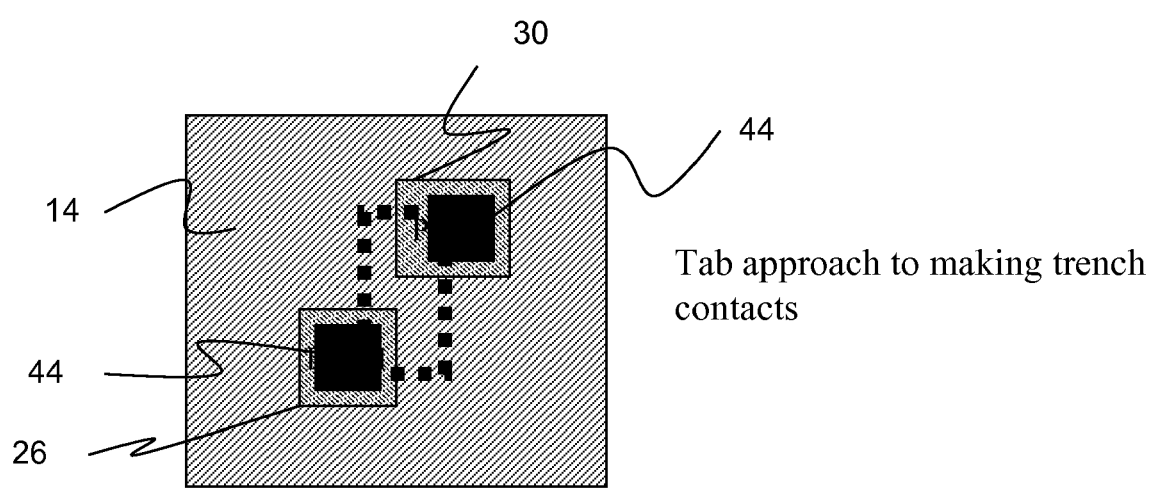

FIGS. 13a and 13b show top views of structures of the present invention after back of the line processes, e.g., formation of contacts 44. It should be understood by those of skill in the art that the formation of the contacts 44 includes an etching process, which can etch away portions of the dielectric material 28 to expose the underlying layer 26. In this way the contacts 44 can be formed to contact both the layer 26 and the layer 30, extending at least partially within the trench dielectric boundary. FIG. 13b shows a tab approach of making the trench contacts with the novel structure of FIG. 12.

IC Product Assemblies

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central The terminology used herein is for the purpose of describing particular embodiments only and is not intended to be limiting of the invention. As used herein, the singular forms "a", "and" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method comprising:
   depositing at least one layer of material on a wafer body;
   forming a trench in the wafer body by etching the wafer body and through a portion of the at least one layer deposited on the wafer body;
   depositing a first dielectric material on the wafer body in the trench and on a top layer of the at least one layer of material deposited outside of the trench;
   forming a first plate on the first dielectric material by depositing a single layer in the trench and extending outside of the trench and isolated from the wafer body by the first dielectric material;
   depositing a second dielectric material on the first plate inside of the trench and outside of the trench; and
   forming a second plate independent of the first plate, the second plate being formed on the second dielectric material and extending outside of the trench and isolated from the wafer body and the first plate.

2. The method of claim 1, wherein the top layer of material outside of the trench is SiN that is deposited prior to the forming of the trench.

3. The method of claim 2, wherein the SiN is deposited on a layer of Si material which is deposited on the wafer body prior to the forming of the trench.

4. The method of claim 1, further comprising forming contacts on exposed regions of the first plate and the second plate.

5. The method of claim 1, wherein the forming of the first plate and the second plate comprises depositing a poly material.

6. The method of claim 1, wherein the forming of the first plate and the second plate comprises depositing a metal or metal silicide.

7. The method of claim 1, wherein the at least one layer of material is two layers of Si based materials deposited separately, and prior to the etching of the trench.

8. The method of claim 1, wherein the forming of the trench includes etching through a Si material deposited on the wafer body and the top layer of material which is deposited on the Si material.

9. The method of claim 8, wherein the Si material and the top layer of material are deposited prior to the forming of the trench.

10. The method of claim 9, wherein the first plate, the second plate, the first dielectric material and the second dielectric material are etched back outside of the trench at a same time.

11. The method of claim 10, wherein the first plate, the second plate, the first dielectric material and the second dielectric material extend a same distance from the trench.

12. The method of claim 11, wherein the Si material and the top layer of material are protected during an etching of the first plate, the second plate, the first dielectric material and the second dielectric material such that the Si material and the top layer of material extend a greater distance from the trench than the first plate, the second plate, the first dielectric material and the second dielectric material.

13. A method comprising:
   forming a trench in a wafer body by etching through a portion of Si material directly deposited on the wafer body and another material directly deposited on the Si material;
   forming a first dielectric layer directly on the wafer body in the trench and on the another material outside of the trench;
   forming a first plate directly on the first dielectric layer, the first plate extending from the trench and isolated from a wafer body by the first dielectric layer;
   forming a second dielectric layer on the second plate;
   forming independently a second plate extending from the trench and isolated from the wafer body and the first plate, wherein the second dielectric layer isolates the first plate from the second plate; and forming an isolation structure within the wafer body and on sides of the first plate and the second plate, wherein the first plate and the second plate are connected to contacts at least partially within a trench dielectric boundary.

14. The method of claim 13, wherein the first plate and the second plate are of a same material.

15. The method of claim 13, wherein the first plate and the second plate include a contact region.

16. The method of claim 13, wherein the first plate and the second plate are formed to have exposed regions above the wafer body.

17. The method of claim 13, wherein the trench is scalable to increase or decrease a surface area of the first plate and the second plate thereby increasing or decreasing, respectively, a capacitance target of the structure.

18. The method of claim 13, wherein the first plate and the second plate are formed from one of poly, metal and metal silicide.

19. The method of claim 13, wherein the Si material and the another material which is SiN are deposited prior to the forming of the trench.

20. The method of claim 13, wherein:

the first plate, the second plate, the first dielectric layer and the second dielectric layer are etched back outside of the trench at a same time;

the first plate, the second plate, the first dielectric layer and the second dielectric layer extend a same distance from the trench; and the Si material and the another material are protected during an etching of the first plate, the second plate, the first dielectric layer and the second dielectric layer such that the Si material and the material extend a greater distance from the trench than the first plate, the second plate, the first dielectric layer and the second dielectric layer.

* * * * *